United States Patent
Hua et al.

(10) Patent No.: US 7,455,791 B2
(45) Date of Patent: Nov. 25, 2008

(54) ABRASIVES FOR COPPER CMP AND METHODS FOR MAKING

(75) Inventors: Duen-Wu Hua, Edgewood, MD (US); Frands Nielsen, Havre de Grace, MD (US)

(73) Assignee: J.M. Huber Corporation, Edison, NJ (US)

( * ) Notice: Subject to any disclaimer, the term of this patent is extended or adjusted under 35 U.S.C. 154(b) by 369 days.

(21) Appl. No.: 11/011,805

(22) Filed: Dec. 14, 2004

(65) Prior Publication Data

US 2005/0092962 A1    May 5, 2005

Related U.S. Application Data

(62) Division of application No. 10/367,207, filed on Feb. 14, 2003, now Pat. No. 6,913,634.

(51) Int. Cl.
*H01L 21/302* (2006.01)

(52) U.S. Cl. .................... 216/88; 216/89; 438/692; 438/693

(58) Field of Classification Search ....................... None
See application file for complete search history.

(56) References Cited

U.S. PATENT DOCUMENTS

| 4,040,858 | A | * | 8/1977 | Wason ........................ 106/466 |
| 5,626,715 | A | * | 5/1997 | Rostoker ........................ 438/4 |
| 6,527,818 | B2 | * | 3/2003 | Hattori et al. ................ 51/308 |
| 6,855,635 | B2 | * | 2/2005 | Schumacher et al. ........ 438/692 |
| 2005/0194358 | A1 | * | 9/2005 | Chelle ........................ 216/88 |

* cited by examiner

*Primary Examiner*—Anita K Alanko
(74) *Attorney, Agent, or Firm*—William Parks

(57) ABSTRACT

An aqueous chemical mechanical polishing slurry is provided that comprises precipitated amorphous silica abrasive particles treated with acidic aluminum. Also provided is a method of polishing an electronic component substrate comprising the steps of: a) obtaining an electronic component substrate, the electronic component substrate having an insulating film deposited over it, an interconnection pattern formed in the insulating film, and interconnection material deposited on the insulated film and in the interconnection pattern; and b) polishing the interconnection material until a surface of said insulating film is exposed by using an aqueous chemical mechanical polishing slurry comprising: precipitated amorphous silica abrasive particles treated with acidic aluminum.

5 Claims, 1 Drawing Sheet

ABRASIVES FOR COPPER CMP AND METHODS FOR MAKING

CROSS-REFERENCE TO RELATED APPLICATIONS

This is a divisional of U.S. application Ser. No. 10/367,207, filed Feb. 14, 2003, now U.S. Pat. No. 6,913,634, the content of which is incorporated herein by reference in its entirety for all purposes.

BACKGROUND OF THE INVENTION

Over the past several years there has been a sustained effort by manufactures of integrated circuits to develop a new generation of integrated circuit electronics having very large scales of integration, higher device density, lower power consumption, and faster clock times. The development of this new generation of ICs has been made possible by continued advancements in microelectronic miniaturization. One important aspect of the new advanced microelectronics is that copper has now replaced aluminum as the material from which interconnects are made. (The interconnects are the wire connections that communicate electrical signals to the millions of logical devices arrayed upon an integrated circuit.)

Copper has replaced aluminum for several reasons. It is a better conductor than aluminum, and also has a higher electromigration resistance. (In fact, electromigration resistance is roughly proportional to the melting point of a material, and copper's melting point is almost twice that of aluminum.) Moreover, and perhaps most importantly, by using copper the interconnection lines can be made thinner (even below 0.5 µm) than with aluminum, which is a critical design aspect for increasing integration and device density. Overall replacing aluminum with copper as the interconnection material results in an integrated circuit that has increased chip speed, is more reliable, consumes less power and can actually be less expensive to manufacture.

Of course preparing ICs with copper interconnects also presents certain challenges. In particular, greater care to surface preparation is necessary. Copper interconnects are formed by depositing copper into an interconnection pattern formed in a silicon oxide film that is deposited on a silicon wafer. Often, a barrier metal film (typically formed from Ta) is sputtered over the interconnection pattern before the copper in order to provide a barrier to prevent the diffusion of copper into the insulating silicon oxide film. After the completion of these steps excess copper is left remaining on the surface of the insulating oxide film and over the copper formed in the interconnection pattern. Great care must be taken in removing the excess copper without imparting surface defects while at the same time achieving very close planarization over the wafer surface.

One technique that has been used for preparing the wafer surface by removing the excess copper and planarizing is chemical-mechanical polishing ("CMP"). In CMP a chemically active slurry, which contains sub-micron sized abrasive particles, is utilized to polish and planarize the wafer. CMP involves two concurrent processes: mechanical abrasion of the surface followed by chemical dissolution of the abraded material into the slurry.

Currently, many of these CMP slurries include colloidal silica as the abrasive particles to provide mechanical abrasion. However, while spherical colloidal silica particles are gentle to the wafer surface, and impart the fewest surface defects, they also have the slowest copper removal rate, and provide the smallest amount of effective planarization. In place of colloidal silica, fumed silica can be used instead. But it has been found that fumed silica performs in an essentially complementary fashion to colloidal silica: it has a high removal rate and provides excellent overall planarization, but its particles also can inflict heavy surface damage, and leave innumerable surface defects after polishing.

Besides silica materials other abrasives have been proposed for use in CMP slurries, such as mixed oxides, ceria and alumina. While these materials have met with some success, they typically pose similar problems as the aforementioned colloidal and fumed silicas. For example when ceria is incorporated into CMP slurries, the ceria tends to form agglomerates, which are particularly harsh on wafer surfaces and cause extensive surface damage.

Given the foregoing there is a continuing need to develop CMP slurries that provide sufficient mechanical abrasion so that excess copper is removed at an acceptable rate but without being so excessively abrasive as to inflict severe damage or impart surface defects.

Abrasive-free slurries have been developed that attempt to provide excellent removal rate performance without inflicting severe surface damage. Such slurries may, for example, be formulated as highly alkaline aqueous solutions. Such slurries attempt to perform the most significant fraction of their cleaning by chemical means. These slurry compositions can often provide excellent removal rate performance and because they lack an abrasive they do not scratch wafer surfaces or impart surface defects to the material. However, unfortunately, they have been shown to damage the wafer surface in yet other ways. Most notably, because of the harshness of the formulations that are used, significant erosion and corrosion on wafer surfaces can occur.

Given the foregoing there is a continuing need for a slurry for use in chemical mechanical polishing that effectively removes excess layers from wafers and provides effective surface planarization. This slurry should provide these benefits without imparting surface defects or causing erosion or corrosion of the interconnects on the wafer surface. Additionally, the CMP slurry should provide substantially improved metal selection performance.

BRIEF SUMMARY OF THE INVENTION

The invention includes an aqueous chemical mechanical polishing slurry comprising precipitated amorphous silica abrasive particles treated with acidic aluminum.

The invention also includes a method of chemical mechanical polishing an electronic component substrate comprising the steps of: a) obtaining an electronic component substrate, the electronic component substrate having an insulating film deposited over it, an interconnection pattern formed in the insulating film, and interconnection material deposited on the insulated film and in the interconnection pattern; and b) polishing the interconnection material until a surface of said insulating film is exposed by using an aqueous chemical mechanical polishing slurry comprising: precipitated amorphous silica abrasive particles treated with acidic aluminum.

BRIEF DESCRIPTION OF THE DRAWING

The foregoing summary, as well as the following detailed description of preferred embodiments of the invention, will be better understood when read in conjunction with the appended drawings. For the purpose of illustrating the invention, there is shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
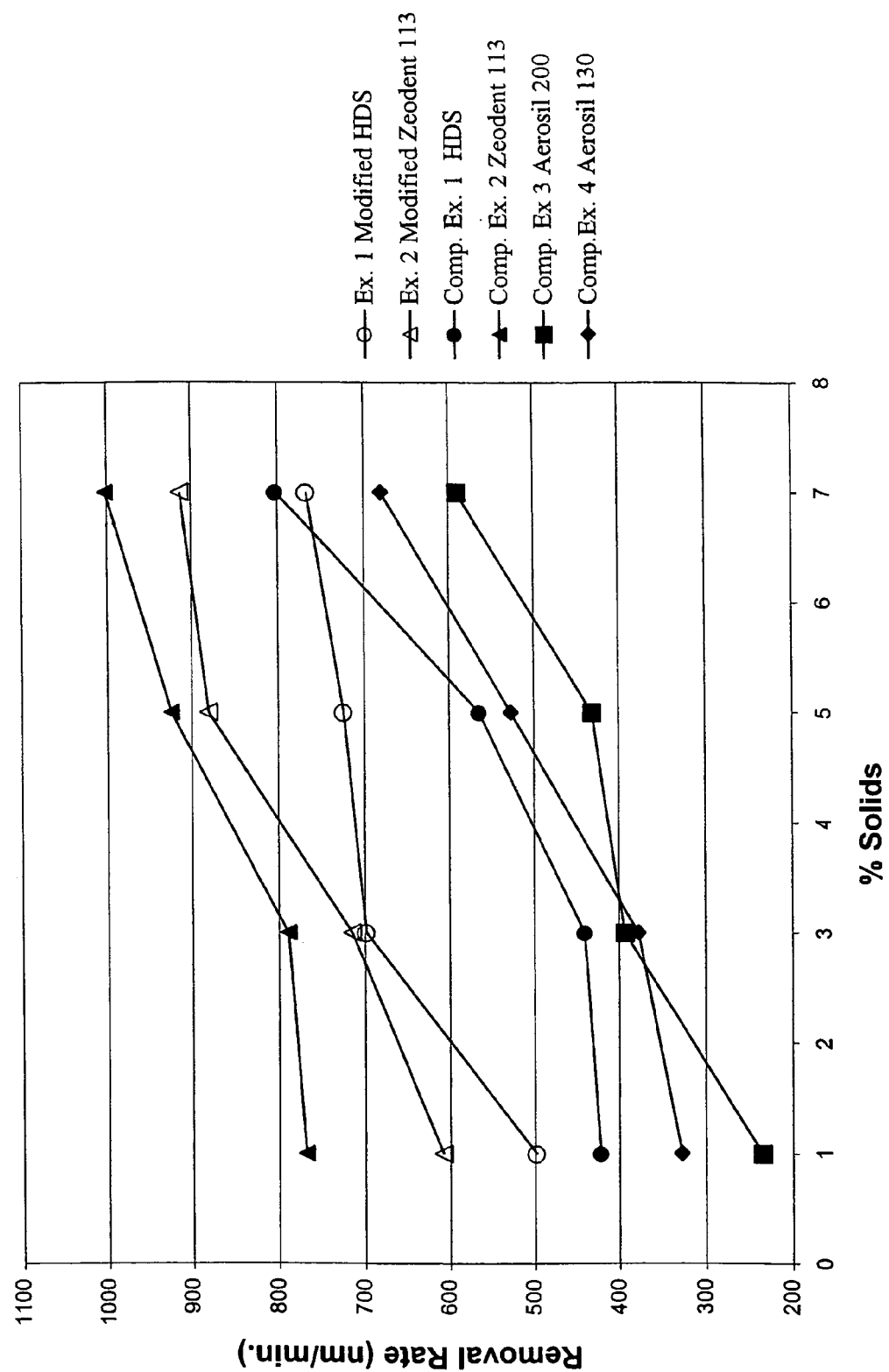
FIG. 1 is a graph illustrating the effect of the concentration of abrasive silica particles in a CMP slurry containing 5 wt % $H_2O_2$ and 1 wt % glycine, on the CMP slurry's Cu removal rate, illustrated for several different slurries.

All parts, percentages and ratios used herein are expressed by weight unless otherwise specified. All documents cited herein are incorporated by reference. The following describes preferred embodiments of the present invention, which provides amorphous, precipitated silica for use in chemical mechanical polishing.

By "slurry" it is meant an aqueous mixture of water and at least one other component, wherein water forms the continuous phase.

By "mixture" it is meant any combination of two or more substances, in the form of, for example without intending to be limiting, a heterogeneous mixture, a suspension, a solution, a sol, a gel, a dispersion, or an emulsion.

The present invention relates to CMP slurries containing precipitated amorphous silica. When applied to a wafer surface, the CMP slurries efficiently remove excess layers from wafers and provide effective surface planarization, without imparting surface defects or causing erosion or corrosion of the wafer surface. Additionally, these CMP slurries have substantially improved metal selection performance through chemistry when compared to prior art materials.

It had previously been thought that precipitated amorphous silica abrasive particles were unsuitable for use in CMP applications because the size of the particles made a CMP slurry containing them particularly abrasive, resulting in microscratches being imparted to the wafer surfaces. However, by the present invention, precipitated silicas have been developed that do not cause extensive scratching on wafer surfaces when used for polishing.

The present invention is directed to polishing the surface of an electronic component substrate, which may be prepared, for example, in the following manner. A silicon oxide insulating film is first formed on a silicon substrate. Then, a "sunken" interconnection pattern is formed in the insulating film, and an interconnection material is deposited (most likely by plating techniques) over the entire surface of the insulating film, so that some of the interconnection material fills in the sunken portion of the interconnection pattern. As discussed above, this interconnection material is preferably copper. Most often, before the interconnection material is deposited by a platting technique, a barrier metal film is applied to the insulating film to prevent the diffusion of the interconnection material into the insulating film. The most common barrier materials are Ta, and TaN. Thus, when the barrier film is present it is located between the insulating film and the interconnection material.

After the wafer surface is formed in this way, the wafer surface is subject to CMP. In CMP metal (e.g., copper) is removed from the high regions of the wafer surface by mechanical action, and then subsequent chemical action dissolves the abraded metal fragments and carries them away. One example CMP process is described in the examples, below.

An electronic component substrate can be subjected to CMP such as a semiconductor chip, a ceramic substrate or a multi-layer ceramic substrate. Other types of electronic component substrates, while not specifically mentioned here, should also be considered to be within the scope of the present invention.

The CMP slurry is preferably aqueous, and contains at least a precipitated amorphous silica along with one or more optional ingredients. The pH of the CMP slurry should be in the range of about 4 to about 10, such as about 4 to about 6, when used for copper CMP. Furthermore, the precipitated amorphous silica particles should exhibit a solids content of between 5 and 20 wt % of the entire slurry, and said particles should exhibit an aluminum (Al) concentration of less than 0.3 wt %, such as between 0.09 and 0.3 wt %. Additionally, at least 75% of said particles should exhibit a particle size of less than 1 micron. A method of preparing precipitated amorphous silicas of the present invention will now be discussed in greater detail. Subsequently, other optional ingredients will be mentioned.

Either of two precipitation methods may be used for preparing the inventive precipitated silica material. In the first precipitation method, an aqueous solution of an alkali metal silicate, such as sodium silicate is added to a reactor. Optionally an alkali metal sulfate, such as sodium sulfate may be added to the reactor and mixed in with the sodium silicate. Any suitable reactor equipped with mixing means adequate to ensure a homogeneous mixture may be used. The aqueous solution of an alkali metal silicate preferably has a concentration of about 1 wt % to about 30 wt %, such as between about 10 wt % to about 30 wt %. The aqueous solution of an alkali metal sulfate preferably has a concentration of about 1 wt % to about 5 wt %.

The reactor is then heated to a temperature of between 60° C. and 95° C., preferably between 70° C. and 85° C., and under constant stirring, an aqueous solution of acidulating agent or acid is added to the reactor mixture, at a relatively constant rate until a first pH level is reached. This first pH level is 6.5-10, such as a pH of 7.0 to 7.8. The aqueous solution of acidulating agent preferably has a concentration of acidulating agent of about 6 wt % to about 35 wt %, such as about 9.0 wt % to about 15 wt %. Suitable acidulating agents or acids include $H_2SO_4$, $H_3PO_4$, $HNO_3$, HCl, $HCO_2H$, $CH_3CO_2H$; sulfuric acid is preferred.

After the reactor mixture reaches its first pH level, there is a simultaneous addition of an acidulating agent and an alkali metal silicate. During this simultaneous addition, the rate of acid addition was adjusted to maintain the pH within the range of 7.3-7.7, while the silicate addition rate was maintained constant. The silicate addition is discontinued after about 0 minutes to about 60 minutes, such as about 30 minutes, but the acid addition continues until the reaction mixture reaches a pH of between 4.5 to 6.5, such as about 5.8 to 6.2, such as about 6.0. The reaction mixture then "digests" for about 0 minutes to about 60 minutes, after which the pH is readjusted to a range of between. 4.5 to 6.5, such as about 5.8 to 6.2, such as about 6.0.

After the completion of the digestion step, the reaction mixture is filtered and washed with water to remove excess inorganic salts until the wash water from the silica filter cake obtains a conductivity of less than about 1600 μmhos. Because the conductivity of the silica filter cake is proportional to the inorganic salt by-product concentration in the filter cake, by maintaining the conductivity of the filtrate to be less than 1600 μmhos it can be ensured that the concentration of inorganic salts, such as $Na_2SO_4$, in the filter cake is not above 2.0 wt %.

The filter cake was then mixed with water to form a slurry having a solids contents of about 10 wt % to about 50 wt %. The filter cake was then treated with an acidic, water-soluble aluminum species such as aluminum sulfate ("alum"), aluminum chloride, or aluminum nitrate. A sufficient amount of alum is added to the slurry so that the Al-treated precipitated silica had an aluminum content of about 0.3 wt % on a dry silica basis. A typical pH value for a 23 wt % aqueous alum solution is about 2.5.

The silica is treated with the acidic aluminum species in order to improve the rheology behavior of the material, so that a slurry having a relatively high concentration of the silica may be formed (in other words a high solids concentration), and yet the slurry is still a flowable liquid that can be pumped into a high energy mill and milled (this step is described in greater detail below). This high slurry solids concentration is necessary in order for the milling step to reduce the particle size of the silica to the submicron level.

Without the acidic aluminum treatment, then when a slurry is formed with a high concentration of silica, the slurry will also have an undesirably high viscosity (e.g., it could be in the form of a gel) that prevents the slurry from being pumped into a mill and milled. By treating the silica with an acidic aluminum species, the pH of a slurry containing the silica is decreased and the viscosity of the slurry is decreased as well.

Alternatively, the acidic aluminum treatment of the silica may occur after the digestion step. In this case, the silica slurry obtained after the completion of the digestion step (having a solids concentration of 5 wt % to 10 wt %) is treated with an acidic aluminum species, and then filtered in a press filter, in a one-step filtration process. Subsequently, the press cake is washed with tap water to 1600 μmhos, and then further washed with deionized water to a filtrate conductivity of less than 300 μmhos.

The Al-treated slurry was then press filtered using a press such as an EIMCO Shriver filter Press (Model M630FB) set a pressure of about 60 psi and washed with deionized water until the filtrate conductivity was less than 300 μmhos.

Thereafter, air was blown on the press cake, and deionized water pumped through the filter to further reduce the salt content to below about 0.2 wt %. Finally, air was blown through the press for 10-15 minutes. The press cake solids was adjusted to about 20 wt % to about 40 wt % and milled using a mill such as a high energy mill such as a bead mill. The silica slurry was pumped through the bead mill at a flow rate of 0.4-7 liters/min. (LPM) such as a flow rate of 0.4-0.5 liters/min (LPM) with the bead mill set at approximately 3000 feet/minute (FPM). The flow rate to the bead mill is dependent on the mill size and type. A production-scale mill would have an increased slurry flow rate and rotation speed to optimize efficiency. Milling can be accomplished in a single discrete milling operation or in multiple passes. Regardless of the mill size and type, and whether the milling is done in a single step or multiple passes, milling is not completed until at least about 75 wt % of the particles have a size of less than 1 μm.

The milled slurry was reslurried with additional deionized water and thereafter fed at a rate of 0.5-0.6 LPM into a decanter centrifuge. The resultant slurry was about 8 wt % to about 16 wt % solids and a had a pH of about 4 to about 5.5.

In the second precipitation method, an aqueous solution of an alkali silicate, such as sodium silicate, is charged into a reactor, such as a reactor equipped with mixing means adequate to ensure a homogeneous mixture, and the aqueous solution of an alkali silicate in the reactor preheated to a temperature of between about 65° C. and about 100° C. Preferably, the alkali silicate aqueous solution has an alkali silicate concentration of approximately 8.0 to 35 wt %, such as from about 8.0 to about 15 wt %. Preferably the alkali silicate is a sodium silicate with a $SiO_2$:$Na_2O$ ratio of from about 1 to about 3.5, such as about 2.5 to about 3.4.

To the reactor is then simultaneously added: (1) an aqueous solution of acidulating agent or acid, such as sulfuric acid, and (2) additional amounts of an aqueous solution containing the same species of alkali silicate as is in the reactor, the aqueous solution being preheated to a temperature of about 65° C. to about 85° C. The aqueous acidulating agent solution preferably has a concentration of acidulating agent of about 6 to 35 wt %, such as about 9.0 to about 15 wt %. The simultaneous addition is continued until the reactor batch pH drops to between about 5.4 to about 6.4.

After the inflows of the acidulating agent and the alkali silicate are stopped, the reactor batch is heated to a temperature of between about 85° C. and 100° C., and the reactor batch allowed to age or "digest" for between 5 minutes to 60 minutes, with the reactor batch being maintained at a constant pH. After the completion of digestion, the reaction batch is filtered and washed with water to remove excess inorganic salts until the wash water from the silica filter cake obtains a conductivity of less than about 1600 μmhos.

The filter cake was then mixed with water to form a slurry, treated with an acidic, water-soluble aluminum species, and processed according to the methods steps described above.

After being precipitated and treated by one of the aforementioned methods, the treated precipitated amorphous silica abrasive can then be incorporated into a CMP slurry. In addition to the abrasive silica particle, the CMP slurry may also contain oxidizing agents to increase the removal rate and the polishing efficiency. One such oxidizing agent is hydrogen peroxide.

In addition to or instead of the oxidizing agent, organic acids such as carboxylic acids and amino acids may be used. Preferred acids include glycine, citric acid, tartaric acid.

If the slurry is aqueous, as is preferred, water provides the balance of the CMP slurry in addition to the additives previously mentioned.

The invention will now be described in more detail with respect to the following, specific, non-limiting examples.

EXAMPLE 1

Silica suitable for use in chemical mechanical polishing (CMP) as well as other applications, was prepared according to the present invention. First, 2575 gallons of an aqueous solution of 1.8% sodium sulfate and 1756 gallons of 24.7 wt % of sodium silicate (having a 3.3 molar ratio of $SiO_2$:$Na_2O$) were charged into a reactor ("the excess silicate") and the reactor contents heated to 176° F. (80° C.). An aqueous solution of sulfuric acid (at a concentration of 7.4 wt %) was added at a rate of 35.3 GPM until the reaction medium reached pH of 7.8.

Next sulfuric acid (7.4 wt %, preheated to 90° F.-32° C.) and sodium silicate (24.7 wt %, preheated to 145° F.-63° C.) were then added simultaneously at the rates of 16.8 and 12.1 GPM, respectively. The reaction pH was maintained at 7.3 to 7.7 during simultaneous addition of acid and silicate. The silicate addition was stopped after 30 minutes and the acid addition continued until the reactor batch pH dropped to 5.4. The batch was digested for ten minutes, with the final pH adjusted and maintained at 5.4. The silica batch was then filtered and washed to form a filter cake having a conductivity of not more than about 1600 μmhos.

About 40 liters (10 gallons) of silica filter cake was reslurried in water (14.5% solids). Alum (aluminum sulfate) was added to the filter cake in a sufficient amount so that the silica contains 0.3 wt % acidic aluminum on a dry silica basis. The alum-treated slurry was press filtered utilizing an EIMCO Shriver Filter Press (Model M630FB) set at about 413 kPa (60 psi) and washed with tap water until the filtrate conductivity was less than 300 μmhos. Thereafter, air was blown on the press cake for 10 minutes and then about 200 liters (50 gallons) of deionized water was pumped through the filter to further reduce the salt content to below 0.4 wt. %. Finally, air was blown through the press for 10-15 minutes. The press cake solids was adjusted to 20 wt. % and milled on a 1.5 liter horizontal mill (Premier, model HML-1.5) containing 1020 ml zirconium beads (0.6-0.8 mm, specific gravity 3.7). The silica slurry was pumped through the bead mill at a flow rate of 0.4-0.5 liters/min (LPM) with the bead mill set at about 915 meters/min (3000 feet/min). The milled slurry was diluted to 12 wt % solids and thereafter fed at a rate of 0.5-0.6 LPM into a Sharpels BM-PF743/54893C3 decanter/centrifuge set at 6000 RPM. The resultant slurry was 10 wt % solids and had a pH of 4.5. Properties of the Al-treated silica of Example 1 are given in Table I below.

EXAMPLE 2

In Example 2, silica suitable for use in chemical mechanical polishing (CMP) was prepared according to the present invention. About 2000 liters (502 gallons) of 13.0 wt % of sodium silicate (having a 2.50 molar ratio of $SiO_2:Na_2O$) was charged into a reactor ("the excess silicate") and the reactor contents heated to 85° C. (185° F.). Thereafter, 11.4 wt % sulfuric acid and 13.0 wt % sodium silicate (2.50 molar ratio, preheated to 85° C. (185° F.)) were then added simultaneously at the rates of 45.0 GPM and 102.4 GPM, respectively. The silicate addition was stopped after 48 minutes and the acid addition continued until the reactor batch pH dropped to a range of from 5.0 to 5.2. The batch was heated to about 93° C. (199° F.) and digested for ten minutes, then the final batch pH readjusted to 5.0 to 5.2. The silica batch was then filtered and washed to form a filter cake having a conductivity of not more than about 1600 μmhos.

10 gallons (about 40 liters) of silica filter cake was reslurried in water (14.5% solids). Alum (aluminum sulfate) was added to the filter cake in a sufficient amount so that the silica contains 0.3 wt % acidic aluminum on a dry silica basis. The alum-treated slurry was press filtered utilizing an EIMCO Shriver Filter Press (Model M630FB) set at 60 psi and washed with tap water until the filtrate conductivity was less than 300 μmhos. Thereafter, air was blown on the press cake for 10 minutes and then about 200 liters (50 gallons) of deionized water was pumped through the filter to further reduce the salt content to below 0.4 wt %. Finally, air was blown through the press for 10-15 minutes. The press cake solids was adjusted to 41.54% and milled on a 10 liter Co-Ball mill (Frymakoruma, model MS-50) containing 7000 ml zirconium beads (0.6-0.8 mm, specific gravity 3.7). The silica slurry was pumped through the bead mill at a flow rate of 3.5 liters/min (LPM). The milled slurry was diluted to 16.93 wt % solids was thereafter fed at a rate of 0.4 LPM into a Sharpels BM-PF743/54893C3 decanter/centrifuge set at 6000 RPM to isolate and collect the particle size fraction containing 100% less than 1 μm. The resultant slurry had a solids content of about 11.7 wt % and a pH of 4.8. Properties of the Al-treated silica of Example 2 are given in Table I below.

COMPARATIVE EXAMPLES 1-2

Comparative Example 1 was prepared exactly as Example 1 above, however, there was no Al-treatment step, so no aluminum species was added to a slurry of the prepared silica The slurry resulting after milling and centifuging/decanting contained 10 wt % solids and 100% of the solids particles have a particle size of less than 1 μm. Properties of the control silica of Comparative Example 1 are given in Table I, below.

Comparative Example 2 was prepared exactly as Example 2 above, however, there was no Al-treatment step, so no aluminum species was added to a slurry of the prepared silica. The slurry resulting after milling and centifuging/decanting contained 8.8 wt % solids and 100% of the solids particles have a particle size of less than 1 μm. Properties of the control silica of Comparative Example 1 are given in Table I, below.

In addition to Comparative Examples 1-2 above, for comparative purposes CMP slurries were prepared containing fumed silicas as abrasive particles. Specifically, the fumed silicas were Aerosil® 200 and Aerosil® 130, available from Degussa Corporation, Parsippany, N.J. The dry powder samples were separately slurried at 10 wt % solids. Properties of the Aerosil® 200 and Aerosil® 130 fumed silicas are set forth in Table I, below.

TABLE I

Slurry Properties

| | Slurry % Solids | Slurry pH | Median Particle Size (μm) | Mean Particle Size (μm) | % Al added | % Al inherent in silica |
|---|---|---|---|---|---|---|
| Example 1 | 10 | 4.5 | 0.128 | 0.224 | 0.3 | 0.13 |
| Example 2 | 11.7 | 4.8 | 0.272 | 0.281 | 0.3 | 0.09 |
| Comparative Ex. 1 | 10 | 6.35 | 0.131 | 0.235 | 0 | 0.06 |
| Comparative Ex. 2 | 8.8 | 6.43 | 0.301 | 0.315 | 0 | 0.04 |
| Aerosil 200 | 10 | 3.98 | 0.293 | 0.799 | 0 | 0 |
| Aerosil 130 | 10 | — | | * | 0 | 0 |

(* Aerosil 130: average primary particle size 16 nm, measured using a Horiba LA910)

Particle size is determined using a Model LA-910 laser light scattering instrument available from Horiba Instruments, Boothwyn, Pa. A laser beam is projected through a transparent cell, which contains a stream of moving particles suspended in a liquid. Light rays striking the particles are scattered through angles which are inversely proportional to their sizes. The photodetector array measures the quantity of light at several predetermined angles. Electrical signals proportional to the measured light flux values are then processed by a microcomputer system to form a multi-channel histogram of the particle size distribution.

The slurry product of Example 1 was retested for particle size after 3 months storage at room temperature and the mean particle size was determined to be 140 nm (0.140 micron), which indicates the slurry is stable, since the particles do not flock together to form larger aggregates.

The slurries of Examples 1-2, Comparative Examples 1-2, and the two fumed silicas were evaluated for removal rate by blanket film polishing on 6-inch copper and tantalum blanket films utilizing a IPEC Westech-372 polisher.

The reported removal rate is an average over two wafers used for every experimental run. The film thickness of copper and tantalum blanket films before and after polishing was measured using an RS-35 four-point probe at 49 points across a diameter. Surface roughness of these films after polishing was measured using a Horizon optical profilometer. The CMP polishing parameters were as follows:

TABLE II

CMP Parameters

| | |
|---|---|
| Polishing pad | IC-1400, k groove |
| Platen speed | 75 rpm |
| Carrier speed | 75 rpm |
| Slurry flow rate | 200 ml/min |
| Polishing pressure | 4 psi |
| Polish time | 1 min |

Using the above CMP parameters, two sets of experiments were conducted. In the first set the effect of abrasive particle concentration on removal rate was tested. In the second set, the effect that changing the hydrogen peroxide and glycine concentration had on copper and tantalum removal rates was tested.

In the first set of experiments each slurry contained 5 wt % hydrogen peroxide ($H_2O_2$) and 1 wt % glycine, but the concentration of the silica abrasive was varied to be either 1, 3, 5 and 7 wt %; the balance of the CMP slurry was water with a sufficient amount of HCl added so as to adjust the pH of each prepared slurry to a pH of 4. The copper removal rate for each of the CMP slurries was evaluated as described above.

In FIG. 1, the measured removal rate is plotted for each slurry showing the effect of the silica concentration on the removal rate. As can be seen in FIG. 1, the CMP slurry containing the silica abrasives prepared in Examples 1-2 (i.e., silica abrasives prepared according to the present invention) showed much higher removal rate performance than all of the prior art silica materials (with the exception of comparative example 2); this was true across almost all silica abrasive particle concentrations, except for the CMP slurries having high abrasive particle concentrations (i.e., 7 wt %) where the concentration of abrasive particle was so high that all of the CMP slurries provided relatively high removal rates.

In a second set of experiments, the effect that changing the slurry chemistry had on copper and tantalum removal rates was measured. Additionally, the number of polishing defects imparted to the wafers' copper surface by polishing was measured. In this set of experiments, all of the CMP slurries were prepared containing 5 wt % of the silica prepared in the examples above and deionized water. Additionally, the CMP slurries also contained 0 wt % $H_2O_2$, 0 wt % Glycine, 5 wt % $H_2O_2$, 5 wt % $H_2O_2$, 1 wt % Glycine, as set forth in Table III, below. The pH of each slurry was then adjusted to a pH of 4 with HCl. Removal rates are expressed in Å/min. The CMP slurries were then used to polish the wafer surface according to the same parameters set forth above. The results (given in Å) are set forth in Table III, below.

As can be seen in Table III, the CMP slurry consisting only of Example 1 abrasive and deionized water removed no copper and significant tantalum, thereby showing a strong selectivity for tantalum, especially as compared to the CMP slurries containing fumed silicas. All of the CMP slurries, regardless of the particular silica abrasive particle they contained, when combined with 5% $H_2O_2$ had essentially the same removal rates for copper and for tantalum, showing little selectivity, with the exception of the CMP slurries containing Aerosil 130, which showed increased selectivity for copper. Additionally, all of the CMP slurries containing 5% $H_2O_2$ and 1% glycine showed good selectivity for copper over tantalum.

To determine the relative harshness of the silica particles, and the extent of polishing defects imparted to the wafers' copper surface by polishing, the surface roughness was measured, with an optical profilometer, using the technique described above. Surface roughness is a measure of deviation from flatness of the wafer surface (defects). Results (in Å) are given in Table IV, below.

TABLE IV

| | Deionized water | 5% $H_2O_2$ | 5% $H_2O_2$ + 1% Glycine |
|---|---|---|---|
| Example 1 | 8-10 | 4-11 | 6-13 |
| Example 2 | 12-21 | 10-17 | 12-18 |
| Comp. Ex. 1 | 27-37 | 4-10 | 5-12 |
| Comp. Ex. 2 | 20-52 | 9-17 | 16-28 |
| Aerosil 200 | 6-15 | 8-16 | 8-14 |
| Aerosil 130 | 10-13 | 6-10 | 6-7 |

As was mentioned above, a CMP slurry containing the silica of Comparative Example 2 was the only prior art silica that provided superior removal rate performance to the CMP slurry containing the silicas of Examples 1 & 2. However, as can be seen in Table IV, this comparable removal rate of Comparative Example 2 comes at a great cost, CMP slurries containing Comparative Example 2 silicas are significantly more damaging to the wafer surface than CMP slurries containing silicas prepared according to Examples 1 & 2. The CMP slurry containing Comparative Example 1 was less damaging to the wafers' copper surface; in some cases being comparable to Examples 1 and 2 in terms of mildness to the wafer surface. However, as can be seen in FIG. 1, CMP slurries containing Comparative Example 1 consistently provided inferior removal rate performance compared to CMP slurries containing silica prepared according to the present invention.

It will be appreciated by those skilled in the art that changes could be made to the embodiments described above without departing from the broad inventive concept thereof. It is understood, therefore, that this invention is not limited to the particular embodiments disclosed, but it is intended to cover

TABLE III

| | Deionized water | | | 5% $H_2O_2$ | | | 5% $H_2O_2$-1% Glycine | | |
|---|---|---|---|---|---|---|---|---|---|
| | Cu | Ta | Cu/Ta | Cu | Ta | Cu/Ta | Cu | Ta | Cu/Ta |
| Example 1 | 0 | 800 | 0 | 270 | 393 | 0.68 | 5958 | 53 | 112 |
| Example 2 | 187 | 114 | 1.64 | 736 | 465 | 1.58 | 8800 | 57 | 154 |
| Comp. Ex. 1 | 115 | 476 | 0.24 | 354 | 339 | 1.04 | 6184 | 39 | 159 |
| Comp. Ex. 2 | 142 | 246 | 0.58 | 1054 | 729 | 1.45 | 9234 | 87 | 106 |
| Aerosil 200 | 914 | 196 | 4.66 | 359 | 115 | 3.12 | 3790 | 29 | 131 |
| Aerosil 130 | 627 | 254 | 2.47 | 598 | 43 | 13.91 | 5268 | 31 | 170 | modifications within the spirit and scope of the present invention as defined by the appended claims.

We claim:

1. A method of chemical mechanical polishing an electronic component substrate comprising the steps of:
   a) obtaining an electronic component substrate, the electronic component substrate having an insulating film deposited over it, an interconnection pattern formed in the insulating film, and interconnection material deposited on the insulated film and in the interconnection pattern; and
   b) polishing the interconnection material until a surface of said insulating film is exposed by using an aqueous chemical mechanical polishing slurry comprising, in a concentration of from about 5 to about 20 wt %, aluminum-treated precipitated amorphous silica abrasive particles, wherein at least 75% of said particles having a particle size of less than 1 micron, and wherein the aluminum content of said aluminum-treated precipitated amorphous abrasive silica particles is from about 0.09 to about 0.3 wt% of the entire amount of said treated silica particles.

2. The method according to claim 1, wherein 100% of the precipitated amorphous silica abrasive particles have a particle size of less than 1 micron.

3. The method according to claim 1, wherein the chemical mechanical polishing slurry further comprises an ingredient selected from the group consisting of hydrogen peroxide, glycine, and mixtures thereof.

4. The method according to claim 1, wherein said chemical mechanical polishing slurry has a pH of about 4 to about 6.

5. The method according to claim 1 wherein said aluminum is acidic aluminum.

* * * * *